US005945727A

United States Patent [19]

Ishiwa

[11] Patent Number: 5,945,727

[45] Date of Patent: Aug. 31, 1999

[54] ELECTRICAL CONTACT OF AN INTEGRAL METAL SHEET TYPE COMPRISING A PIN CONTACT PORTION, A PRESS-FIT PORTION AND A TERMINAL PORTION AND A METHOD OF MANUFACTURING THE SAME

[75] Inventor: Tadashi Ishiwa, Tokyo, Japan

[73] Assignee: Japanese Aviation Electronics Industry, Ltd., Tokyo, Japan

[21] Appl. No.: 08/623,966

[22] Filed: Mar. 29, 1996

[30] Foreign Application Priority Data

Mar. 31, 1995 [JP] Japan .................................... 7-075145

[51] Int. Cl.$^{6}$ ..................................................... H01L 23/48

[52] U.S. Cl. .......................... 257/666; 257/696; 257/697; 438/123

[58] Field of Search .................................... 257/696, 697, 257/666; 438/123

[56] References Cited

U.S. PATENT DOCUMENTS 4,864,079 9/1989 Barlow .................................... 257/696

*Primary Examiner*—Peter Toby Brown
*Assistant Examiner*—Roy Potter
*Attorney, Agent, or Firm*—Laff, Whitesel & Saret, Ltd.

[57] ABSTRACT

An electrical contact (10*b*) comprises a pin contact portion (1*b*), a press-fit portion (2*b*), and a terminal portion (3*b*) integrally formed from a metal sheet which has a flat surface defined by X and Z directions and a predetermined thickness in a Y direction. The press-fit portion as a first flat portion extends in the Z direction with a first end (2*b*α) and a second end (2*b*β) opposite to each other. The pin contact portion extends from the first end in the X direction. The terminal portion as a second flat portion extends from the second end continuously in the X and the Z directions with a leg portion (3*b*α) extending in the Z direction and a foot portion (3*b*β) extending from the leg portion in the X direction. The foot portion serves as a connecting portion to be connected to a conductive portion formed on an electrical circuit board. A method of manufacturing the electrical contact comprises a punching process in which the metal sheet is punched in the Y direction to form a contact blank having a temporary pin contact portion, the press-fit portion, and the terminal portion, and a pin-forming process in which the temporary pin contact portion is press-formed in the Z direction to obtain the pin contact portion having a generally circular cross section of a diameter greater than the predetermined thickness.

7 Claims, 9 Drawing Sheets

ELECTRICAL CONTACT OF AN INTEGRAL METAL SHEET TYPE COMPRISING A PIN CONTACT PORTION, A PRESS-FIT PORTION AND A TERMINAL PORTION AND A METHOD OF MANUFACTURING THE SAME

BACKGROUND OF THE INVENTION

This invention relates to an electrical contact which is for use in an electrical connector of a surface mounting type directly mounted on an electrical circuit board and which is integrally formed from a metal sheet of a conductive plate, and a method of manufacturing the same.

A conventional electrical contact of the type described comprises a pin contact portion at its top end, a press-fit portion extending from the pin contact portion, and a terminal portion extending from the press-fit portion in a backward direction to form a substantially L shape.

All these portions are integrally formed. The press-fit portion is press-fitted into an insulator for the electrical connector. The terminal portion has a top end connected to a conductive pad formed on the electrical circuit board by soldering. The pin contact portion is fitted to and contacted with an electrical socket contact of a mating connector.

Such electrical contact is manufactured in the manner which will presently be described. At first, a single metal sheet having a predetermined thickness is punched to form a contact blank having a temporary shape including a temporary pin contact portion, a press-fit portion, and a temporary terminal portion. The temporary pin contact portion is then shaped into the pin contact portion of a pin shape having a substantially circular cross section. The temporary terminal portion extending therefrom is press-formed to have a thickness smaller than the diameter of the pin contact portion. Thereafter, the temporary terminal portion is subjected to a bending process to form the terminal portion having a substantially L shape.

In the electrical contact thus manufactured, it is assumed that a longitudinal direction of the pin contact portion and the press-fit portion is defined as a X direction. The terminal portion comprises a leg portion extending in a Z direction perpendicular to the X direction, and a foot portion bent from the leg portion and extending in the X direction. The leg portion defines a height with respect to the pin contact portion. The foot portion serves as a connecting portion to be connected to the conductive pad formed on the electrical circuit board. Generally, the thickness of the press-fit portion is substantially equal to or slightly greater than the diameter of the pin contact portion. In many cases, the thickness of the press-fit portion is equal to that of the metal sheet.

In the conventional electrical contact, the thicknesses of the pin contact portion and the press-fit portion in the Z direction are substantially equal to that of the metal sheet from which the contact blank is punched out. On the other hand, the widths of the press-fit portion and the terminal portion in a Y direction perpendicular to an X-Z plane are greater than the thickness of the metal sheet in order to assure a mechanical strength during a press-fitting operation.

With this structure, when a plurality of the electrical contacts are fitted into an insulator of the electrical connector to be arranged adjacent to one another, an alignment pitch of the adjacent electrical contacts can not be made smaller than the widths of the press-fit portion and the terminal portion. This inevitably restricts the density of the electrical contacts. Thus, the electrical connector comprising a plurality of the electrical contacts fitted into the insulator is inhibited from increasing the density of the electrical contacts.

As described, the height of the pin contact portion in the Z direction is defined by the leg portion of the terminal portion. Since the leg portion and the foot portion of the terminal portion are formed by the bending process, a constant working accuracy is difficult to obtain. Again, in such an electrical connector comprising a plurality of the electrical contacts fitted into the insulator, the height at the pin contact portion of each electrical contact often suffers a dimensional error. In addition, soldering of the foot portion (connecting portion) of the terminal portion and the conductive portion (such as the conductive pad) of the electrical circuit board is often incomplete.

SUMMARY OF THE INVENTION

Taking the above into consideration, the present invention is made in order to solve the above-mentioned problems.

It is a first technical object of the present invention to provide an electrical contact which is capable of substantially increasing the density in contact alignment within the insulator, and to provide a method of manufacturing the same.

It is a second technical object of the present invention to provide an electrical contact which is manufactured through a reduced number of processes with an excellent dimensional accuracy, and to provide a method of manufacturing the same.

Briefly speaking, the present invention provides an electrical contact which is capable of increasing the density in contact alignment within an insulator and improving a dimensional accuracy to assure reliable connection to a mating element, which can be easily manufactured, and which is compact in size. This invention also provide a method of manufacturing the same.

According to this invention, there is provided an electrical contact of an integral metal plate type for use in an electrical connector to be directly mounted on an electrical circuit board, which comprises a first plate portion having a predetermined shape to be press-fitted into an insulator of the electrical connector in a first direction, the first plate portion having a predetermined plate thickness in a second direction perpendicular to the first direction, the first plate portion having a first end and a second end opposite to each other in the first direction, respectively; a pin contact portion to be brought into contact with a mating socket contact element, the pin contact portion extending in the first direction from the first end of the first plate portion, the pin contact portion having a generally circular section of a diameter greater than the predetermined plate thickness; and a second plate portion continuously extending from the second end of the first plate portion both in the first direction and in a third direction perpendicular to the first and the second directions, the second plate portion having an extended end in the third direction as a connecting portion to be connected to a conductive portion formed on the electrical circuit board, the second plate portion having the predetermined plate thickness in the second direction.

In the above-mentioned electrical contact, the second plate portion may comprise a leg portion extending in the third direction and a foot portion extending from the leg portion in the first direction, the foot portion serving as the connecting portion.

The above-mentioned electrical connector may be a single piece formed from a conductive plate having the predetermined plate thickness by punching and pin-forming processes.

In the above-mentioned electrical connector, the pin contact portion may have a generally ellipse cross section having different diameters in the second and the third directions.

According to this invention, there is also provided an electrical connector to be directly mounted on an electrical circuit board, comprising an insulator having a plurality of contact holding apertures formed therein and arranged in a row with a predetermined pitch; and a plurality of contacts press-fitted into the apertures, respectively, each of the contacts comprising a first plate portion having a predetermined shape to be press-fitted into the insulator in a first direction, the first plate portion having a predetermined plate thickness in a second direction perpendicular to the first direction, the first plate portion having a first end and a second end opposite to each other in the first direction, respectively; a pin contact portion to be brought into contact with a mating socket contact element, the pin contact portion extending in the first direction from the first end of the first plate portion, the pin contact portion having a generally circular section of a diameter greater than the predetermined plate thickness; and a second plate portion continuously extending from the second end of the first plate portion both in the first direction and in a third direction perpendicular to the first and the second directions, the second plate portion having an extended end in the third direction as a connecting portion to be connected to a conductive portion formed on the electrical circuit board, the second plate portion having the predetermined plate thickness in the second direction.

According to this invention, there is also provided a method of manufacturing an electrical connector comprising the steps of punching a conductive plate having a plane defined by a first direction and a third direction perpendicular to the first direction and having a predetermined plate thickness in a second direction perpendicular to the first and the third directions to thereby form a contact blank of a predetermined shape comprising a first plate portion, a temporary pin contact portion, and a second plate portion, the first plate portion extending in the first direction and having a first end and a second end opposite to each other in the first direction, respectively, the temporary pin contact portion extending from the first end in the first direction, the second plate portion continuously extending from the second end in the first and the third directions; and press-forming the temporary pin contact portion in the third direction to form a pin contact portion having an elliptical section of a diameter greater than the predetermined plate thickness.

DESCRIPTION OF THE PREFERRED EMBODIMENT

Prior to description of an embodiment of the present invention, a conventional electrical contact 10*a* will at first be described with reference to FIG. 1 so as to facilitate an understanding of the present invention.

Figure 1:
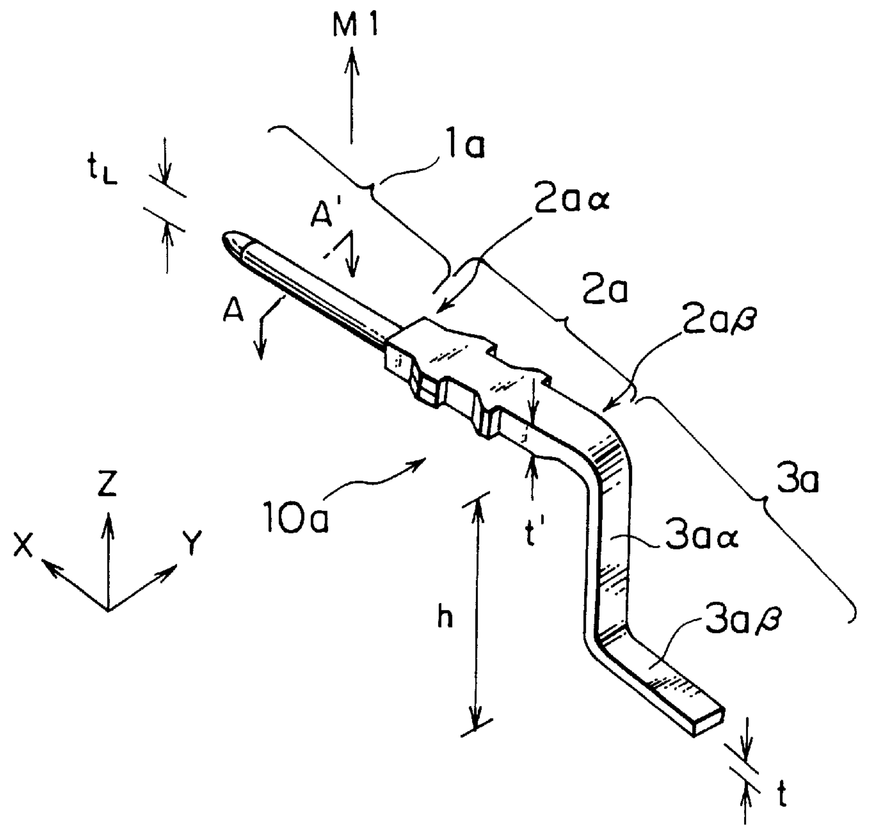
PRIOR ART FIG. 1
FIG. 1 is a perspective view of a conventional electrical contact.

Referring to FIG. 1, the electrical contact 10*a* comprises a pin contact portion 1*a*, a press-fit portion 2*a*, and a terminal portion 3*a* integrally formed from a metal sheet (conductive plate) through a punching process, a forming process, and a bending process. The pin contact portion 1*a* is adapted to be fitted and contacted with a mating electrical socket contact. The press-fit portion 2*a* is adapted to be press-fitted into an insulator for an electrical connector. The terminal portion 3*a* is of a substantially L shape and is adapted to be connected to a conductive portion (conductive pad) of a mating electrical circuit board.

The press-fit portion 2*a* of the electrical contact 10*a* extends in a first direction depicted at X (hereinafter referred to as the X direction) and is press-fitted into the insulator in the X direction. The press-fit portion 2*a* has a first end 2*a*α and a second end 2*a*β opposite to each other in the X direction. A thickness t' of the press-fit portion 2*a* in the X direction is equal to that of the metal sheet.

Figure 2:
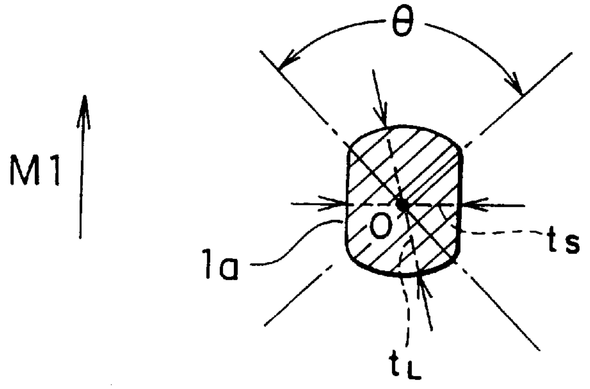
PRIOR ART FIG. 2
FIG. 2 is an enlarged sectional view of the electrical contact illustrated in FIG. 1 taken along line A-A'.

The pin contact portion 1*a* of a pin shape extends from the first end 2*a*α of the press-fit portion 2*a* in the X direction. The pin contact portion 1*a* has a generally circular cross section taken along a plane perpendicular to the X direction. Specifically, as shown in FIG. 2 which is an enlarged sectional view taken along a line A-A' in FIG. 1, the pin contact portion 1*a* has a substantially elliptical cross section defined by a long diameter $t_L$ in a punching direction M1 coincident with a third direction depicted at Z (hereinafter referred to as the Z direction) perpendicular to the X direction and by a short diameter $t_S$ in a second direction depicted at Y (hereinafter referred to as the Y direction) perpendicular to both of the X direction and Z direction (punching direction M1). A part of the pin contact portion 1*a* that has the long diameter $t_L$ is within a range defined by a center angle θ around a center axis O of the pin contact portion 1*a*.

The terminal portion 3*a* comprises a leg portion 3*a*α extending from the second end 2*a*β in the Z direction and a foot portion 3*a*β extending from the leg portion 3*a*α in the X direction. The foot portion 3*a*β serves as a connecting portion to be connected to a conductive pad formed on the electrical circuit board. The thickness t of the terminal portion 3*a* in the Z direction is smaller than the thickness t' of the press-fit portion 2*a* and the metal sheet. The leg portion 3*a*α defines a height h of the pin contact portion 1*a*.

In the electrical contact 10*a,* the thickness of the press-fit portion 2*a* and the terminal portion 3*a* in the Z direction is relatively thin. On the other hand, the width of the press-fit portion 2*a* and the terminal portion 3*a* in the Y direction is relatively wide.

For example, the thickness t' of the press-fit portion 2*a* and the metal sheet is equal to 0.5 mm while the thickness t of the terminal portion 3*a* in the Z direction is equal to 0.25 mm. The long diameter $t_L$ of the pin contact portion 1*a* is equal to 0.44 mm.

Figure 3:
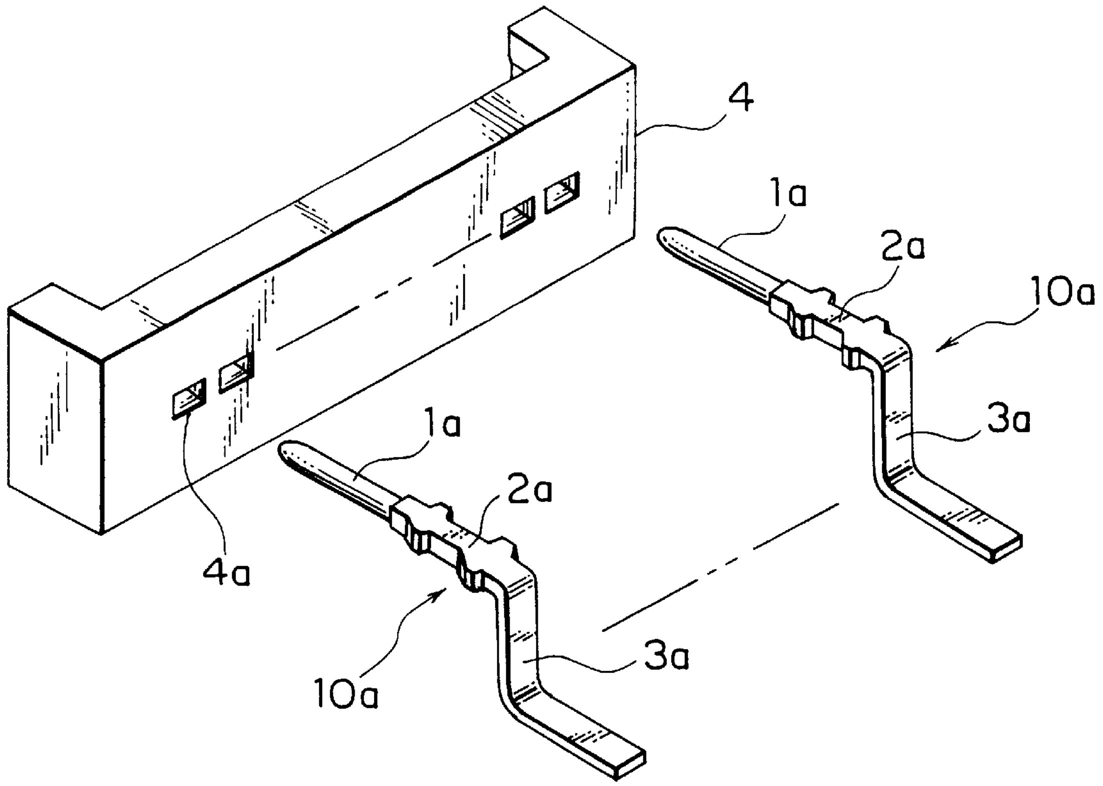
PRIOR ART FIG. 3
FIG. 3 is a perspective view for describing an operation of fitting into an insulator a plurality of the electrical contacts shown in FIG. 1.

Referring to FIG. 3, the electrical contact 10*a* of the above-mentioned structure is combined with an insulator 4 to form an electrical connector. Specifically, the insulator 4 is provided with a predetermined number of contact holding apertures aligned at a predetermined pitch. The press-fit portions 2*a* of the electrical contacts 10*a,* equal to the predetermined number, are press-fitted into the contact holding apertures 4*a,* respectively.

Figure 4:
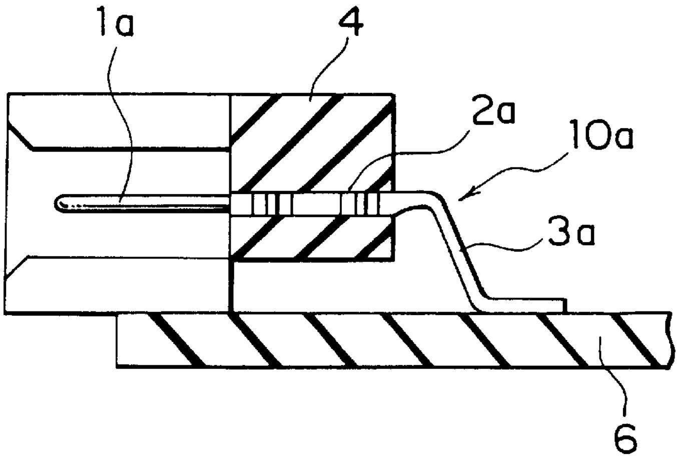
PRIOR ART FIG. 4
FIG. 4 is a side sectional view showing a basic structure of an electrical connector formed by fitting the electrical contacts into the insulator as illustrated in FIG. 3.

Referring to FIG. 4, the electrical connector is directly mounted on the electrical circuit board 6. The foot portions 3*a*β (connecting portion) of the terminal portions 3*a* of the electrical contacts 10*a* are connected by soldering to the predetermined number of conductive pads formed on the electrical circuit board 6, respectively.

Figure 5:
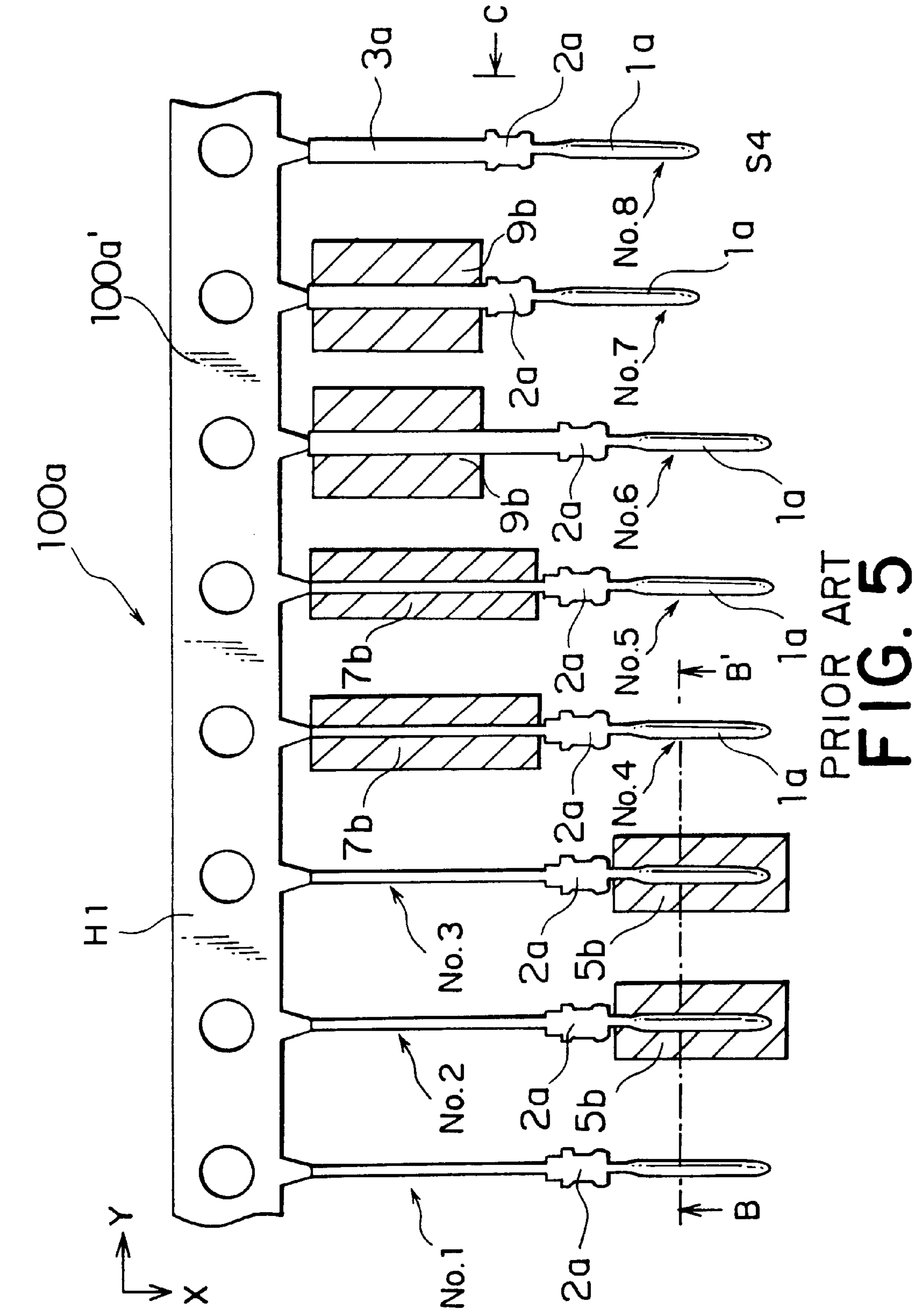
PRIOR ART FIG. 5
FIG. 5 is a plan view for describing a process of manufacturing the electrical contact illustrated in FIG. 1.
Figure 6:
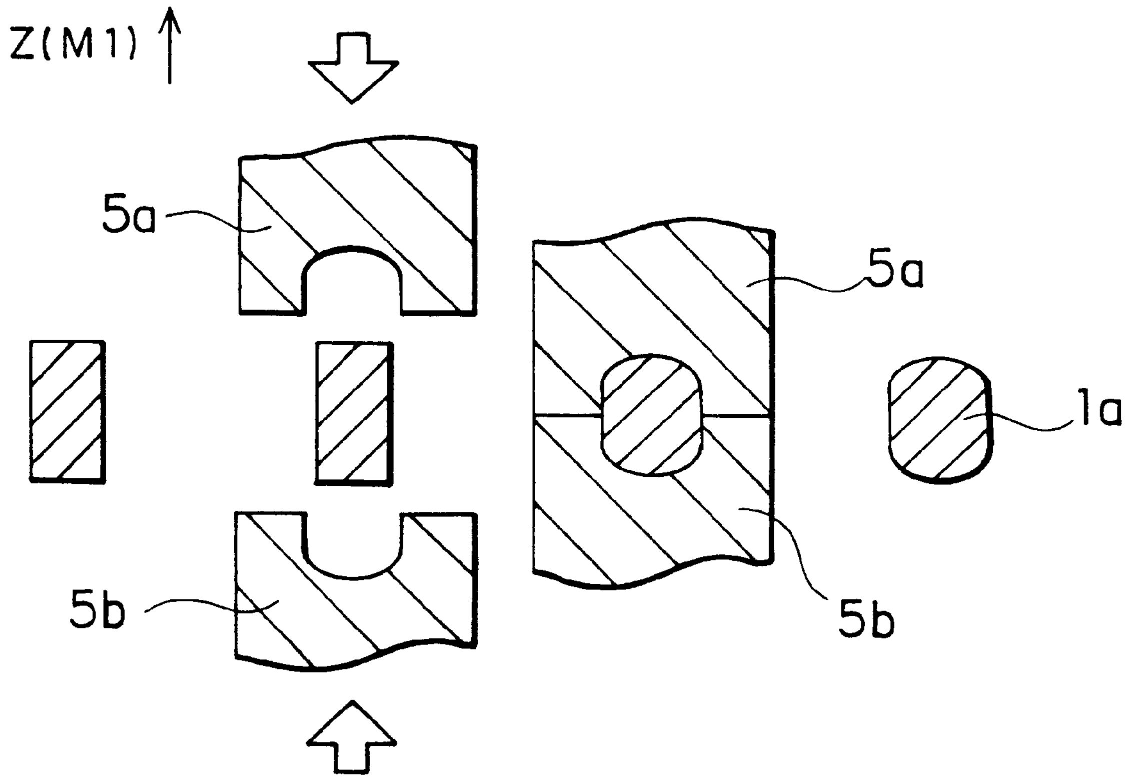
PRIOR ART FIG. 6
FIG. 6 is an enlarged sectional view for describing an initial or first stage of the process illustrated in FIG. 5 taken along a line B-B'.
Figure 7:
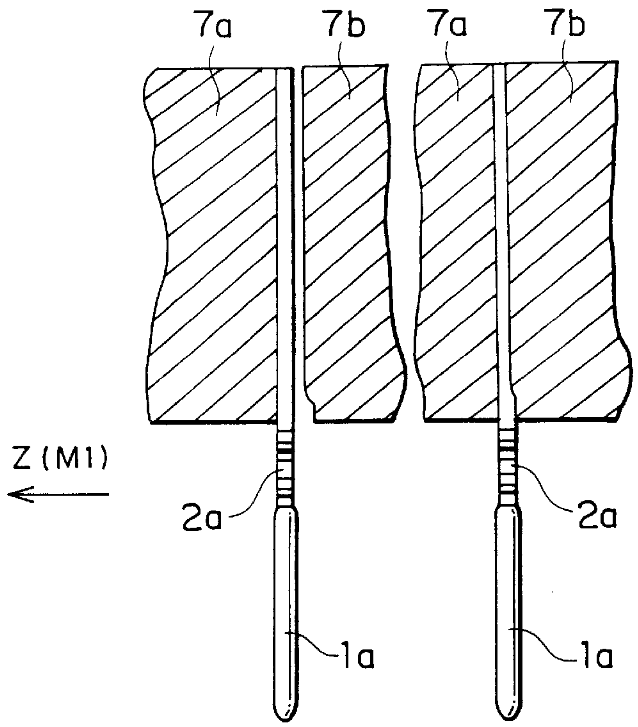
PRIOR ART FIG. 7
FIG. 7 is an enlarged side sectional view for describing an intermediate of second stage of the process illustrated in FIG. 5 taken along an arrow C.
Figure 8:
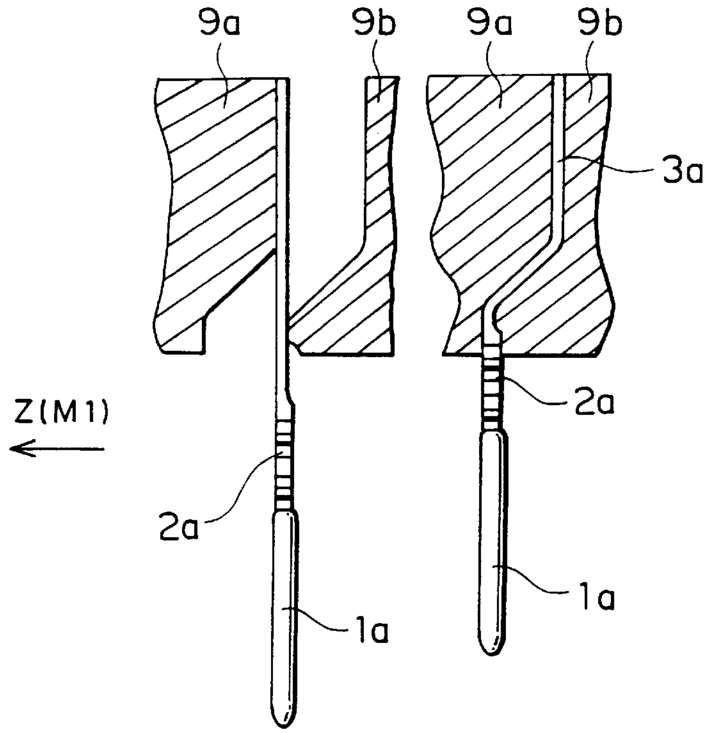
PRIOR ART FIG. 8
FIG. 8 is an enlarged side sectional view for describing a final or third stage of the process illustrated in FIG. 5 taken along the arrow C.

Referring to FIG. 5, the electrical contact 10*a* of the type described is manufactured by the use of a metal sheet 100*a* having a flat surface H1 defined by the X direction and the Y direction perpendicular to the X direction and having the predetermined thickness in the Z direction perpendicular to the X and the Y directions. The metal sheet is subjected to a punching process, a forming process, and a bending process, as will hereafter be described in detail with reference to FIGS. 5 through 8.

The punching process is at first carried out. Specifically, the single metal sheet 100*a* of the predetermined thickness is punched to obtain a contact blank having a temporary shape including a temporary pin contact portion, a press-fit portion 2*a,* and a temporary terminal portion. It is noted here that the temporary shape obtained through this process corresponds to a configuration labelled No. 1 in FIG. 5.

Next, in a first forming process, the temporary pin contact portion is press-formed in the punching direction M1 (Z direction) by the use of a press-forming upper mold 5*a* and a press-forming lower mold 5*b* to obtain the pin contact portion 1*a* of a pin shape having a substantially circular cross section. The state during this process corresponds to those configurations labelled No. 2 and No. 3 in FIG. 5. The pin contact portion 1*a* thus formed is clearly shown in a configuration labelled No. 4 in FIG. 5 relating to a subsequent process.

In a second forming process as the subsequent process, the temporary terminal portion is press-formed in the punching direction M1 (z direction) by the use of a press-forming upper mold 7*a* and a press-forming lower mold 7*b* to obtain a substantially flat shape with the thickness of the temporary terminal portion smaller than that of the press-fit portion 2*a*. The state during this process corresponds to those configurations labelled No. 4 and No. 5 in FIG. 5. The temporary terminal portion of a flat shape thus formed is clearly seen in a configuration labelled No. 6 relating to a following process.

In the bending process as the following process, the temporary terminal portion of a flat shape is bent and shaped in the punching direction M1 (Z direction) by the use of a bending upper mold 9*a* and a bending lower mold 9*b* to form the terminal portion 3*a* having a substantially L shape. The state during this process corresponds to those configurations labelled No. 6 and No. 7 in FIG. 5. The terminal portion 3*a* thus formed is clearly seen in a configuration labelled No. 8 relating to a succeeding process.

Finally, in a cutting process as the succeeding process, the electrical contact 10*a* of the configuration labelled No. 8 including the pin contact portion 1*a,* the press-fit portion 2*a,* and the terminal portion 3*a* is cut off from a metal sheet carrier 100*a'*.

In the above-mentioned manufacturing process of the electrical contact 10*a,* however, it is required to carry out, after the punching process, the forming process and the bending process by the use of the press-forming molds and the bending molds in order to form the terminal portion 3*a*. This requires an increased number of steps and a lot of labor and time. This results in an increase in manufacturing cost.

The width of the electrical contact 10*a* in the Y direction, namely, the width direction of the press-fit portion 2*a* and the terminal portion 3*a* is greater than the thickness of the metal sheet. In the electrical connector with the predetermined number of the electrical contacts 10*a* fitted into the insulator 4 to be adjacent to one another, an alignment pitch between the adjacent electrical contacts 10*a* is restricted to the width of the electrical contact 10*a*. In other words, the alignment pitch can not be smaller than the width of the electrical contact 10*a*. This inhibits an increase in density of the electrical contacts 10*a* arranged within the insulator 4.

In the meanwhile, the height of the pin contact portion 1*a* is defined in the Z direction by the leg portion 3*a*α of the terminal portion 3*a*. Since the leg portion 3*a*α and the foot portion 3*a*β of the terminal portion 3*a* are formed by the bending process, a constant working accuracy is difficult to obtain. In the electrical connector with the predetermined number of the electrical contacts 10*a* fitted into the insulator 4, the height of each of the pin contact portions 1*a* of the electrical contacts 10*a* often suffers a dimensional error. In addition, at the foot portion (connecting portion) 3*a*β of the terminal portion 3*a* connected to the conductive portion (such as the conductive pad) of the electrical circuit board 6, soldering by reflowing is often incomplete.

Figure 9:
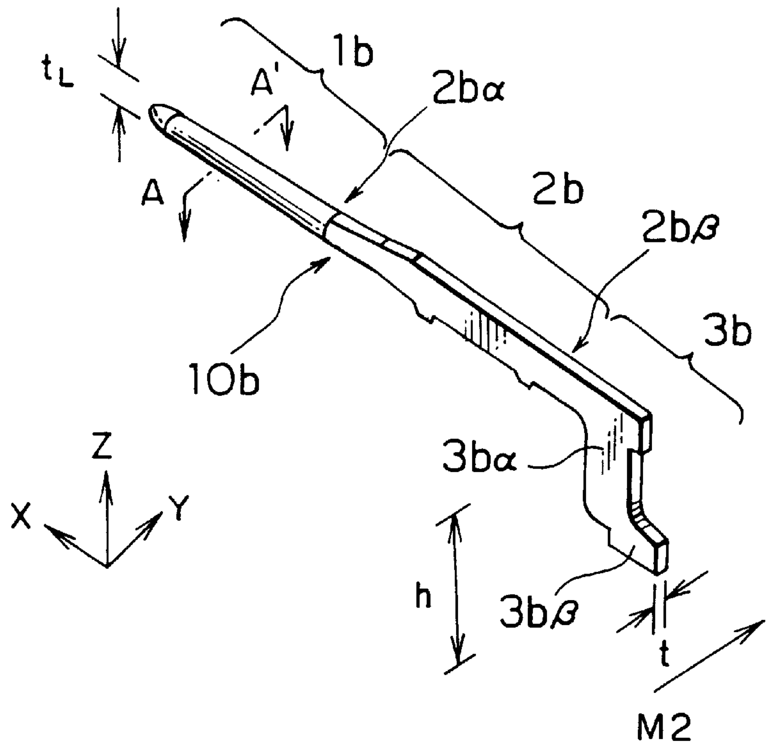
FIG. 9 is a perspective view of an electrical contact according to one embodiment of the present invention.

Now, description will proceed to an embodiment of this invention. Referring to FIG. 9, an electrical contact 10*b* according to the embodiment of this invention comprises a pin contact portion 1*b,* a press-fit portion 2*b,* and a terminal portion 3*b* integrally formed. The press-fit portion 2*b* as a first flat portion extends in the X direction (first direction) and has a first end 2*b*α and a second end 2*b*β opposite to each other in the X direction. The pin contact portion 1*b* extends from the first end 2*b*α in the X direction. The terminal portion 3*b* as a second flat portion extends from the second end 2*b*β continuously in the X direction and in the Z direction (third direction).

The electrical contact 10*b* is manufactured from a metal sheet (conductive plate) of a predetermined thickness through a punching process and a pin-forming process. Herein, a punching direction M2 of punching the metal sheet is coincident with to the Y direction (second direction). The thickness of the press-fit portion 2*b* and the terminal portion 3*b* in the Y direction is equal to that of the metal sheet.

The pin contact portion 1*b* of a pin shape extends from the first end 2*b*α of the press-fit portion 2*b* in the X direction. The pin contact portion 1*b* has a generally circular cross section taken along a plane perpendicular to the X direction.

Figure 10:
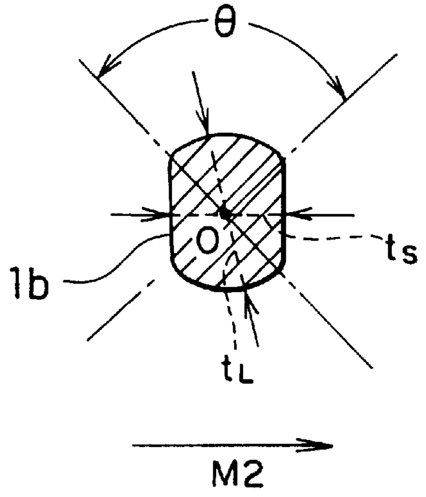
FIG. 10 is an enlarged sectional view of the electrical contact illustrated in FIG. 9 taken along a line A-A'.

Specifically, as shown in FIG. 10 which is an enlarged sectional view taken along a line A-A' in FIG. 9, the pin contact portion 1*b* has a substantially elliptical cross section defined by a short diameter $t_S$ in the punching direction M2 (Y direction) and by a long diameter $t_L$ in the Z direction (third direction) perpendicular to the punching direction M2 (Y direction). A part of the pin contact portion 1*b* that has the long diameter $t_L$ is within a range defined by a center angle θ around a center axis O of the pin contact portion 1*b*.

The terminal portion 3*b* comprises a leg portion 3*b*α extending from the second end 2*b*β in the Z direction and a foot portion 3*b*β extending from the leg portion 3*b*α in the X direction. The foot portion 3*b*β serves as a connecting portion to be connected to a conductive portion (conductive pad) formed on the electrical circuit board. The leg portion 3*b*α of the terminal portion 3*b* defines a height h of the pin contact portion 1*b*.

In the electrical contact 10*b*, the thickness of the press-fit portion 2*b* and the terminal portion 3*b* in the Y direction is relatively thin. On the other hand, the width of the press-fit portion 2*b* and the terminal portion 3*b* in the Z direction is relatively wide.

For example, the thickness t of the press-fit portion 2*b*, the terminal portion 3*b*, and the metal sheet is equal to 0.25 mm. The long diameter $t_L$ of the pin contact portion 1*b* is equal to 0.44 mm.

Although the terminal portion 3*b* in this embodiment comprises the leg portion 3*b*α and the foot portion 3*b*β which serves as the connecting portion to be connected to the conductive pad, the configuration of the terminal portion 3*b* is not restricted to that illustrated in the figure. As far as an extended end in the Z direction serves as the connecting portion, the terminal portion 3*b* may have any other configuration.

In the manner similar to that described in conjunction with FIG. 3, the electrical contact 10*b* of the above-mentioned structure is combined with an insulator to form an electrical connector. Specifically, the insulator is provided with a predetermined number of contact holding apertures aligned at a predetermined pitch. The press-fit portions 2*b* of the electrical contacts 10*b*, equal to the predetermined number, are press-fitted into the contact holding apertures, respectively. It is to be noted that the predetermined pitch of the contact holding apertures formed in the insulator is considerably small as compared with that illustrated in FIG. 3.

Figure 11:
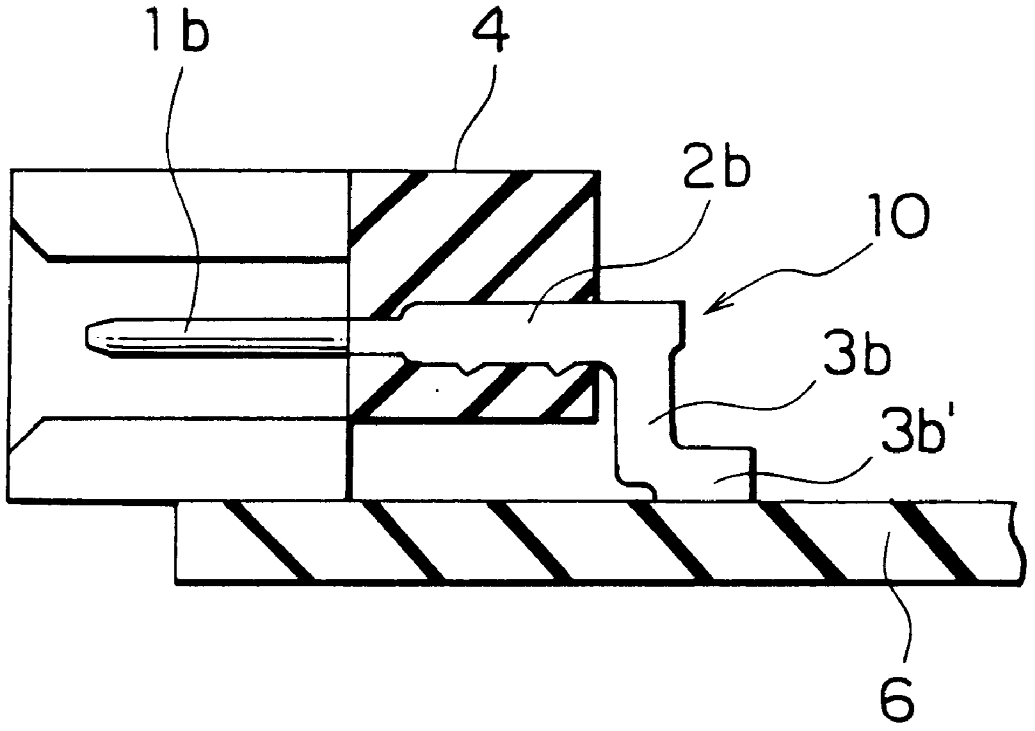
FIG. 11 is a side sectional view showing a basic structure of an electrical connector comprising the electrical contacts in FIG. 9 fitted into an insulator.
Figure 12:
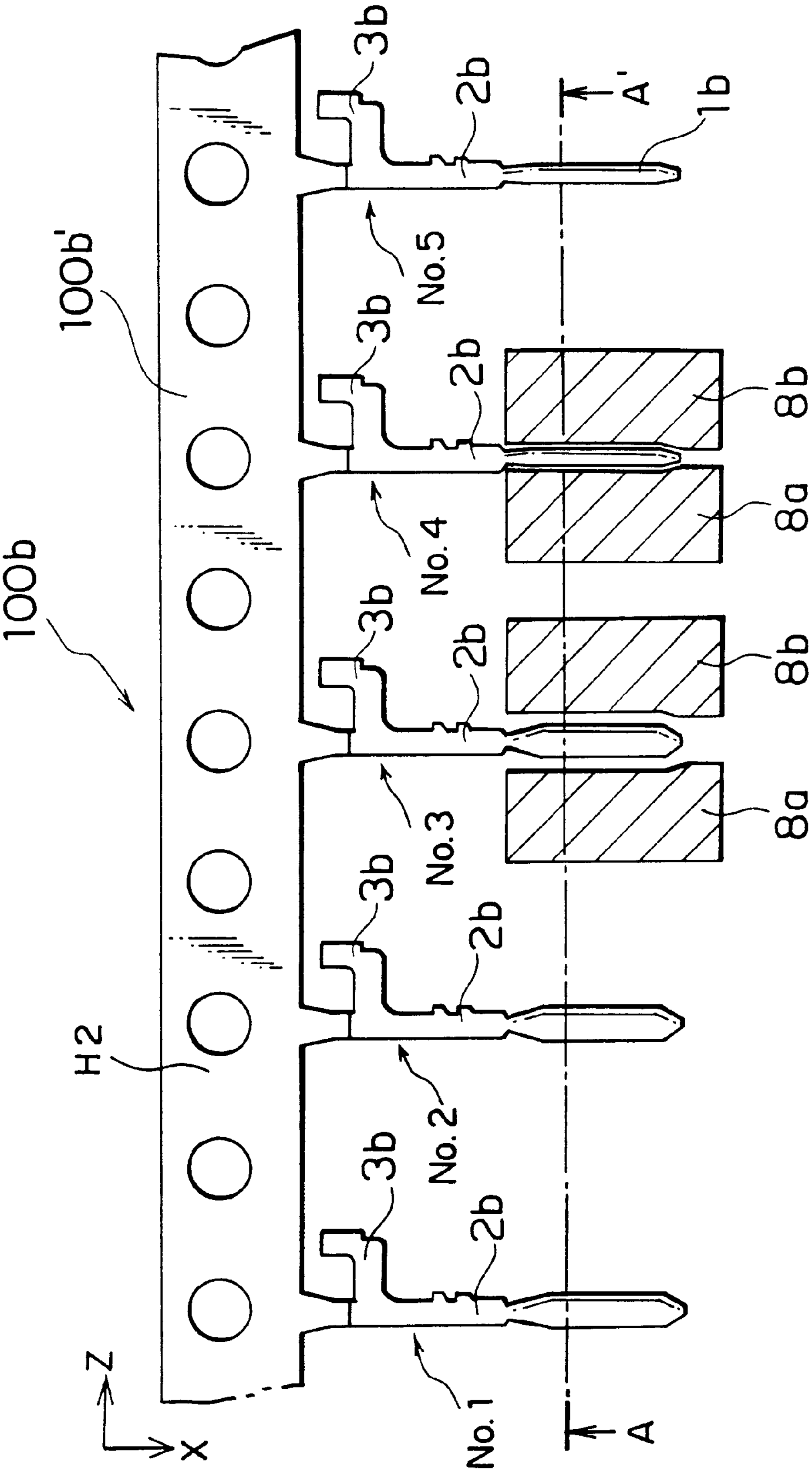
FIG. 12 is a plan view for describing a process of manufacturing the electrical contact illustrated in FIG. 9.
Figure 13:
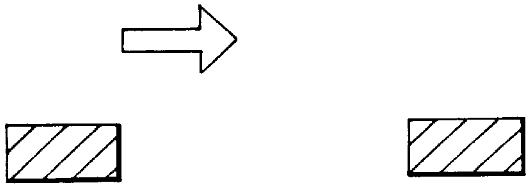
FIG. 13 is an enlarged sectional view for describing an initial or first stage of the process illustrated in FIG. 12 taken along a line A-A'.
Figure 14:
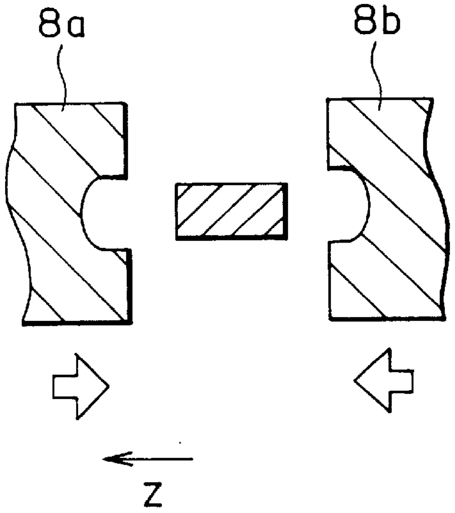
FIG. 14 is an enlarged sectional view for describing an intermediate or second stage of the process illustrated in FIG. 12 taken along the line A-A'.
Figure 15:
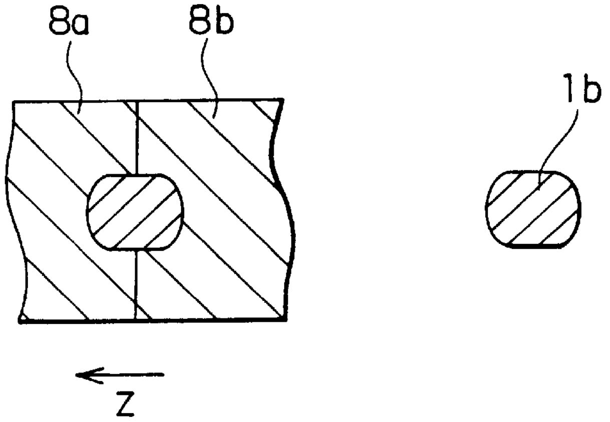
FIG. 15 is an enlarged sectional view for describing a final or third stage of the process illustrated in FIG. 12 taken along the line A-A'.

Referring to FIG. 11, the electrical connector is directly mounted on the electrical circuit board 6. The foot portions 3*b*β (connecting portion) of the terminal portions 3*b* of the electrical contacts 10*b* are connected by soldering to the predetermined number of the conductive pads formed on the electrical circuit board 6, respectively.

Referring to FIGS. 12 through 15, the electrical contact 10*b* of the type described is manufactured by the use of a metal sheet 100*b* having a flat surface H2 defined by the X direction and the Z direction perpendicular to the X direction and having the predetermined thickness in the Y direction perpendicular to the X and the Z directions. The metal sheet is subjected to a punching process and a forming process as will hereafter be described in detail with reference to FIGS. 12 through 15.

The punching process is at first carried out. Specifically, the single metal sheet 100*b* of the predetermined thickness is punched to obtain a contact blank having a temporary shape including a temporary pin contact portion, a press-fit portion 2*b*, and a terminal portion 3*b*. It is noted here that the temporary shape obtained through this process corresponds to configurations labelled No. 1 and No. 2 in FIG. 12.

Next, in the forming process, the temporary pin contact portion is press-formed in the Z direction by the use of a press-forming upper mold 8*a* and a press-forming lower mold 8*b* to obtain the pin contact portion 1*b* of a pin shape having a substantially circular cross section. The state during this process corresponds to those configurations labelled No. 3 and No. 4 in FIG. 12. The pin contact portion 1*b* thus formed is clearly shown in a configuration labelled No. 5 in FIG. 12 relating to a subsequent process.

Finally, in a cutting process as the subsequent process, the electrical contact 10*b* of the configuration labelled No. 5 including the pin contact portion 1*b*, the press-fit portion 2*b*, and the terminal portion 3*b* is cut off from a metal sheet carrier 100*b'*.

In the above-mentioned manufacturing process of the electrical contact 10*b*, it is sufficient to simply carry out, after the punching process, the press-forming process by the use of the press-forming molds in order to form the pin contact portion 1*b*, without any bending process. This reduces the number of steps as well as labor and time. It is therefore possible to manufacture the electrical connector at a low cost.

In the electrical contact 10*b*, the thickness of the press-fit portion 2*b* and the terminal portion 3*b* in the punching direction M2 (Y direction) is equal to that of the metal sheet while the width of the press-fit portion 2*b* and the terminal portion 3*b* in the Z direction is relatively wide. In the electrical connector with the predetermined number of the electrical contacts 10*b* fitted into the insulator to be adjacent to one another, an alignment pitch between the adjacent electrical contacts 10*b* can be reduced around the thickness of the press-fit portion 2*b* and the terminal portion 3*b*. As a result, the density of the electrical contacts 10*b* can be increased. Thus, in the electrical connector comprising those electrical contacts 10*b* fitted into the insulator, the density of the electrical contacts 10*b* can be remarkably increased with a relatively small structure.

In the meanwhile, the height of the pin contact portion 1*b* is defined in the Z direction by the leg portion 3*b*α of the terminal portion 3*b*. Since the leg portion 3*b*α and the foot portion 3*b*β of the terminal portion 3*b* are formed by the punching process alone, a constant working accuracy can be obtained. In the electrical connector with the predetermined number of the electrical contacts 10*b* fitted into the insulator, the height of each of the pin contact portions 1*b* of the electrical contacts 10*b* is uniform. In addition, at the foot portion (connecting portion) 3*b*β of the terminal portion 3*b* connected to the conductive portion (such as the conductive pad) of the electrical circuit board 6, soldering by reflowing is successfully and accurately carried out.

What is claimed is:

1. An electrical contact of an integral metal plate type for use in an electrical connector to be directly mounted on an electrical circuit board, which comprises:

a first plate portion having a predetermined shape to be press-fitted into an insulator of said electrical connector in a first direction, said first plate portion having a predetermined plate thickness in a second direction perpendicular to said first direction, said first plate portion having a first end and a second end opposite to each other in said first direction, respectively;

a pin contact portion to be brought into contact with a mating socket contact element, said pin contact portion extending in said first direction from said first end of said first plate portion, said pin contact portion having a generally circular section of a diameter greater than said predetermined plate thickness; and a second plate portion continuously extending from said second end of said first plate portion both in said first direction and in a third direction perpendicular to said first and said second directions, said second plate portion having an extended end in said third direction as a connecting portion to be connected to a conductive portion formed on said electrical circuit board, said second plate portion having said predetermined plate thickness in said second direction, said press-fitted portion and said connecting portion being in the same plane.

2. An electrical contact as claimed in claim 1, wherein said second plate portion comprises a leg portion extending in said third direction and a foot portion extending from said leg portion in said first direction, said foot portion serving as said connecting portion.

3. An electrical contact as claimed in claim 1 or 2, which is a single piece formed from a conductive plate having said predetermined plate thickness by punching and pin-forming processes.

4. An electrical contact as claimed in any one of claims 1 and 2, wherein said pin contact portion has a generally ellipse cross section having different diameters in said second and said third directions.

5. An electrical connector to be directly mounted on an electrical circuit board comprising an insulator having a plurality of contact holding apertures formed therein and arranged in a row with a predetermined pitch; and a plurality of contacts press-fitted into said apertures, respectively, each of said contacts comprising:

a first plate portion having a predetermined shape to be press-fitted into said insulator in a first direction, said first plate portion having a predetermined plate thickness in a second direction perpendicular to said first direction, said first plate portion having a first end and a second end opposite to each other in said first direction, respectively;

a pin contact portion to be brought into contact with a mating socket contact element, said pin contact portion extending in said first direction from said first end of said first plate portion, said pin contact portion having a generally circular section of a diameter greater than said predetermined plate thickness; and a second plate portion continuously extending from said second end of said first plate portion both in said first direction and a third direction perpendicular to said first and said second directions, said second plate portion having an extended end in said third direction as a connecting portion to be connected to a conductive portion formed on said electrical circuit board, said second plate portion having said predetermined plate thickness in said second direction said press-fitted portion and said connecting portion being in the same plane.

6. A method of manufacturing an electrical connector of claim 5 comprising the steps of:

punching a conductive plate having a plane defined by a first direction and a third direction perpendicular to said first direction and having a predetermined plate thickness in a second direction perpendicular to said first and said third directions to thereby form a contact blank of a predetermined shape comprising a first plate portion, a temporary pin contact portion, and a second plate portion, said first plate portion extending in said first direction and having a first end and a second end opposite to each other in said first direction, respectively, said temporary pin contact portion extending from said first end in said first direction, said second plate portion continuously extending from said second end in said first and said third directions; and press-forming said temporary pin contact portion in said third direction to form a pin contact portion having an elliptical section of a diameter greater than said predetermined plate thickness.

7. An electrical contact as claimed in claim 3, wherein said pin contact portion has a generally elliptical cross section having different diameters in said second and third directions.

* * * * *